(12) United States Patent
Hou et al.

(10) Patent No.: US 11,088,069 B2
(45) Date of Patent: Aug. 10, 2021

(54) SEMICONDUCTOR PACKAGE AND SEMICONDUCTOR DEVICE

(71) Applicant: Taiwan Semiconductor Manufacturing Co., Ltd., Hsinchu (TW)

(72) Inventors: Hao-Cheng Hou, Hsinchu (TW); Chien-Hsun Lee, Hsin-chu County (TW); Chung-Shi Liu, Hsinchu (TW); Jung-Wei Cheng, Hsinchu (TW); Tsung-Ding Wang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/547,583

(22) Filed: Aug. 22, 2019

(65) Prior Publication Data

US 2021/0057331 A1 Feb. 25, 2021

(51) Int. Cl.
*H01L 23/522* (2006.01)
*H01L 23/528* (2006.01)
*H01L 23/00* (2006.01)
*H01L 23/31* (2006.01)

(52) U.S. Cl.
CPC ...... *H01L 23/5226* (2013.01); *H01L 23/3171* (2013.01); *H01L 23/5283* (2013.01); *H01L 24/09* (2013.01); *H01L 24/17* (2013.01); *H01L 2224/02373* (2013.01); *H01L 2224/02379* (2013.01); *H01L 2224/02381* (2013.01)

(58) Field of Classification Search
CPC . H01L 24/09; H01L 23/5383; H01L 23/5226; H01L 23/3171; H01L 2224/023; H01L 2224/77; H01L 2224/02381; H01L 2224/02379; H01L 2224/02373; H01L 23/5283; H01L 24/17
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,756,038 B1* | 8/2020 | Chiu | H01L 23/3185 |

* cited by examiner

*Primary Examiner* — Jasmine J Clark
(74) *Attorney, Agent, or Firm* — JCIPRNET (57) ABSTRACT

A semiconductor package includes a semiconductor die encapsulated by an insulating encapsulation, a redistribution circuit structure disposed over the semiconductor die and the insulating encapsulation, the redistribution circuit structure being electrically connected to the semiconductor die; and a conductive feature having a first portion embedded in the redistribution circuit structure and a second portion connected to the first portion, the first portion having a first long axis and a first short axis perpendicular to the long axis in a top view, the second portion disposed over and electrically connected to the first portion. A semiconductor device having the semiconductor package, a circuit substrate and a circuit board is also provided.

20 Claims, 7 Drawing Sheets

SEMICONDUCTOR PACKAGE AND SEMICONDUCTOR DEVICE

BACKGROUND

The semiconductor industry has experienced rapid growth due to continuous improvements in the integration of various electronic components (e.g. transistors, diodes, resistors, capacitors, etc.) in an integration circuit (IC) device. For the most part, this improvement in integration has come from repeated reductions in minimum feature size and increase in semiconductor die and/or semiconductor package sizes, which allows more components to be integrated into a given device. The increase in size of semiconductor packages has led to an increase in coefficient of thermal expansion (CTE) mismatch between the semiconductor package and the substrate (e.g. ball grid array (BGA) substrate, printed circuit board (PCB) etc.) connected to the semiconductor package. The increase in CTE mismatch between the semiconductor package and substrate increases the stress imposed on the semiconductor package, which may lead to defects such as delamination of layers in redistribution circuit structures (RDLs) or breakage of interconnecting lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
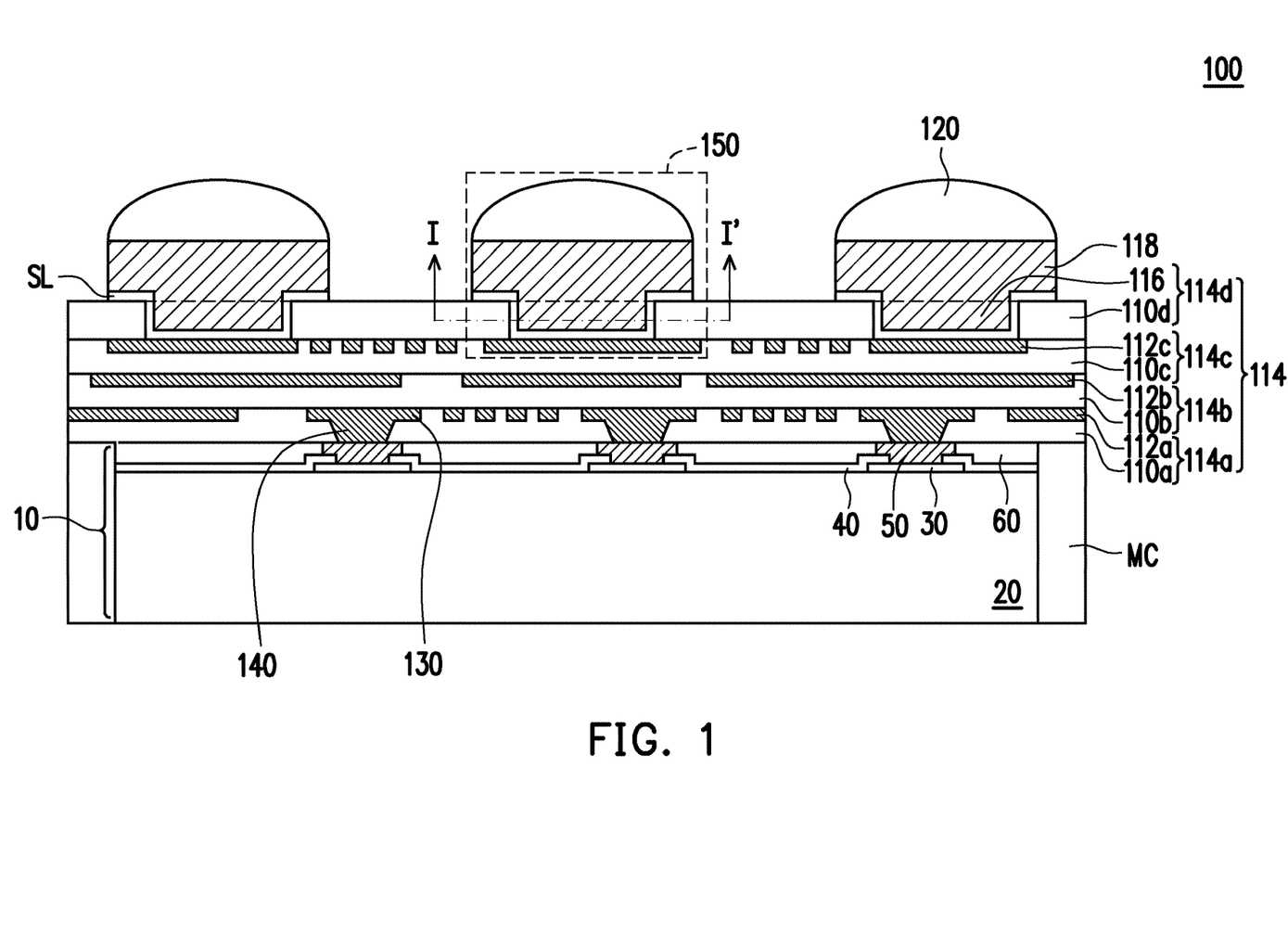
FIG. 1 illustrates a cross-sectional view of a semiconductor package in accordance with some embodiments.

FIG. 1 illustrates a cross-sectional view of a semiconductor package 100 in accordance with some embodiments. The semiconductor package 100 is an integrated fan-out (InFO) package including a semiconductor die 10 embedded in an insulating encapsulant MC, a redistribution circuit structure (RDL) 114 formed over the semiconductor die 10 and the insulating encapsulant MC, conductive posts 118 protruding out of the RDL 114, and solder layer 120 over the conductive posts 118. Although one semiconductor die 10 is illustrated in FIG. 1, in some embodiments, the semiconductor package 100 may have more than one semiconductor die 10, and the number of semiconductor die 10 is not limited.

The semiconductor die 10 may include substrate 20, connection pads 30, passivation layer 40, conductive pillars 50 and dielectric layer 60. Active devices (e.g., transistors or the like) and passive devices (e.g., resistors, capacitors, inductors or the like) may be formed in the substrate 20. In accordance with some embodiments, the substrate 20 includes a crystalline silicon substrate. In accordance with other embodiments, the substrate 20 includes an elementary semiconductor substrate such as germanium; a compound semiconductor substrate including silicon carbon, gallium arsenic, gallium phosphide, indium phosphide, indium arsenide, and/or indium antimonide; an alloy semiconductor substrate including SiGe, GaAsP, AlInAs, AlGaAs, GaInAs, GaInP, and/or GaInAsP; or combinations thereof. Other semiconductor substrates such as multi-layered or gradient substrates may also be used as substrate 20.

The connection pads 30 are formed over the substrate 20 to electrically connect to the active devices and passive devices in the substrate 20. The connection pads 30 may include a conductive material such as aluminum (Al), copper (Cu), or other suitable metal. The passivation layer 40 such as an oxide film, a nitride film, a dielectric film (such as benzocyclobutene (BCB), polybenzoxazole (PBO)), or the like, is formed over the substrate 20 and expose portions of the connection pads 30. The portions of the connection pads 30 exposed by the passivation layer 40 is physically and electrically connected to the conductive pillars 50 formed thereon. The conductive pillars 50 may be formed of metals as copper, titanium, tungsten, aluminum, or the like. The conductive pillars 50 may be embedded in the dielectric layer 60 and have top surfaces substantially leveled with the top surface of the dielectric layer 60. For example, the dielectric layer 60 may be a polybenzoxazole (PBO) layer, a polyimide (PI) layer or other suitable polymers. In some alternative embodiments, the dielectric layer 60 may be made of inorganic materials.

Still referring to FIG. 1, the semiconductor die 10 may be laterally encapsulated by the insulating encapsulant MC. The insulating encapsulant MC may include epoxy resin or other suitable dielectric materials. In some embodiments, the semiconductor die 10 are System on Chip (SoC) dies. In some alternative embodiments, the semiconductor die 10 may be logic dies, which may be Central Processing Unit (CPU) dies, Micro Control Unit (MCU) dies, Input-Output (TO) dies, BaseBand (BB) dies, or Application processor (AP) dies. In some other alternative embodiments, the semiconductor die 10 may be a memory die (e.g. high bandwidth memory (HBM) die, dynamic random access memory (DRAM) die, static random access memory (SRAM) die etc.), a graphical processing unit (GPU) die, power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), or the like, or a combination thereof.

The RDL 114 formed over the semiconductor die 10 and the insulating encapsulant MC may include multiple layers 114a, 114b, 114c, and 114d. The layer 114a is disposed right over the semiconductor die 10 and the insulating encapsulant MC. The layer 114a includes dielectric layer 110a and conductive features 112a embedded therein. In some embodiments, the dielectric layer 110a may be formed of the same material as dielectric layer 60 of the semiconductor die 10 and is not repeated herein. In some embodiments, the conductive features 112a may include metals as copper, titanium, tungsten, aluminum, or the like. The conductive features 112a include redistribution wirings 130 and conductive vias 140. The conductive vias 140 are located between the redistribution wirings 130 and conductive pillars 50, and electrically connects the redistribution wirings 130 to the semiconductor die 10 through the conductive pillars 50. In some embodiments, the conductive vias 140 may have a tapered shape having smaller diameter near the conductive pillars 50.

The layer 114b including dielectric layer 110b and conductive features 112b embedded in the dielectric layer 110b are disposed on the layer 114a. The conductive features 112b include redistribution wirings and conductive vias (not shown) that electrically connects to the semiconductor die 10 through the layer 114a. The dielectric layer 110b and the conductive features 112b may be similar to dielectric layer 110a and conductive features 112a respectively, and details of which are not repeated herein. The layer 114c including dielectric layer 110c and conductive features 112c embedded in the dielectric layer 110c are disposed on the layer 114b. The conductive features 112c include redistribution wirings and conductive vias (not shown) that electrically connects to the semiconductor die 10 through the layers 114a and 114b. The dielectric layer 110c and the conductive features 112c may be similar to dielectric layer 110a and conductive features 112a respectively, and details of which are not repeated herein. Although not separately illustrated, seed layers may be formed on the bottom surfaces and side surfaces of conductive features 112a, 112b and 112c.

In some embodiments, the layer 114c is the layer of the RDL 114 spaced furthest apart from the semiconductor die 10 that has redistribution wirings. Therefore, the layer 114d disposed over the layer 114c may include dielectric layer 110d and conductive vias 116 that are connected to the conductive posts 118 protruding out of the dielectric layer 110d. In some embodiment, the conductive vias 116 and the conductive posts 118 are formed by a same process and may be regarded as first portions and second portions of a same conductive feature. The conductive vias 116 may include conductive materials such as copper, aluminum, gold, nickel, silver, palladium, tin, or the like, or the combination thereof.

In some embodiments, the conductive vias 116 may have sidewalls substantially perpendicular to the top surface of the dielectric layer 110d, that is, the conductive vias 116 are not tapered. The conductive vias 116 are physically and electrically connected to the conductive features 112c. The conductive features 112c directly under the conductive vias 116 may be referred to as landing pads, and may have a circular top view, as shown in FIGS. 2A-2D. As shown in FIG. 1, a seed layer SL is formed between bottom surfaces of conductive vias 116 and the conductive features 112c, between sidewalls of conductive vias 116 and the dielectric layer 110d, and between conductive posts 118 and top surface of the dielectric layer 110d. In some embodiments, the seed layer SL is a metal layer, which may be a single layer or a composite layer comprising sub-layers formed of different materials. In some embodiments, the seed layer SL includes a titanium layer and a copper layer over the titanium layer.

The conductive posts 118 protruding out from the dielectric layer 110d may be controlled collapse chip connection (C4) bumps and may include conductive materials such as copper, aluminum, gold, nickel, silver, palladium, tin, or the like, or the combination thereof. The solder layer 120 is formed over the conductive posts 118 to facilitate bonding of the semiconductor package 100 to other circuit substrates (e.g. circuit substrate 500 in FIG. 5) or circuit boards. A portion 150 of the semiconductor package 100 corresponding to one conductive via 116 and one conductive post 118 will be discussed below with reference to FIGS. 2A-2D.

FIGS. 2A-2D illustrate sectional views along the cut line I-I' of a portion 150 of the semiconductor package 100 in accordance with various embodiments. Note that the sectional views of FIGS. 2A-2D is also a top view of the portion 150. In FIGS. 2A-2D, various embodiments of the portion 150 having different conductive vias 116 are shown. The various embodiments of the portion 150 corresponding to FIGS. 2A-2D are henceforth referred to as portions 150a, 150b, 150c and 150d, respectively, while the different conductive vias 116 corresponding to portions 150a, 150b, 150c and 150d are henceforth referred to as conductive vias 116a, 116b, 116c and 116d. As the sectional view is along the cut line I-I', in FIGS. 2A-2D, only conductive vias 116a, 116b, 116c and 116d are represented by solid lines, while other components within the portion 150 not crossed by the cut line I-I' are represented by dotted or dashed lines.

Figure 2A:
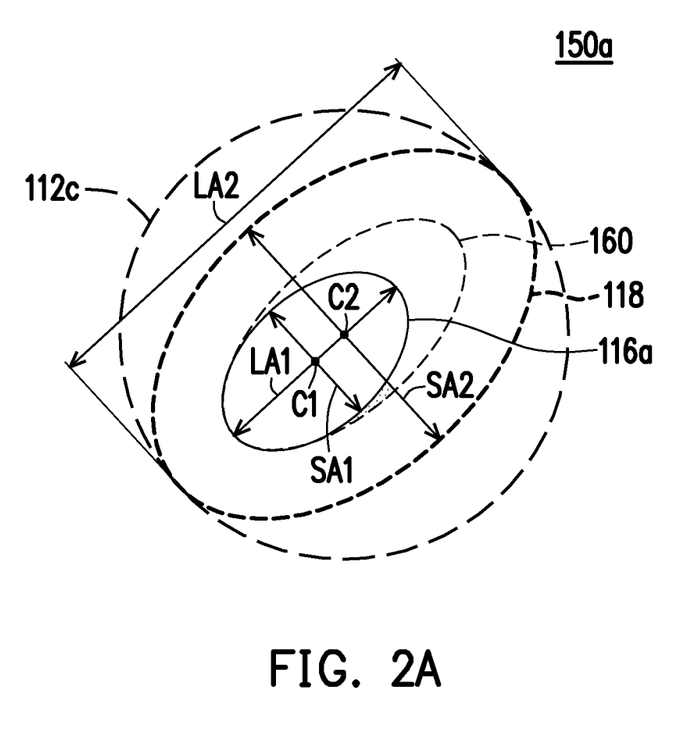
FIGS. 2A-2D illustrate sectional views along the cut line I-I' of a portion of the semiconductor package of FIG. 1 in accordance with various embodiments.

In FIG. 2A, the conductive features 112c on which the conductive via 116a are formed has a circular shape and is one of the pads on which the conductive via 116a is formed, i.e. landing pads. For ease of description, the circular conductive feature 112c of FIGS. 2A-2D will be referred to as landing pad 112c. The landing pad 112c may have a diameter of between about 25 μm to about 500 μm. The area of the landing pad 112c may be larger than the area of the conductive via 116a and conductive posts 118 to be discussed below. In FIG. 2A, the conductive via 116a has an elongated shape, particularly, an oval shape. In some embodiments, the length to width ratio of the conductive via 116a in the top view is between about 1.1 to about 40. The elongated conductive via 116a (i.e. oval) may be described in terms of a long axis LA1 and a short axis SA1.

In some embodiments, a long axis may be defined as the longest line connecting two points of an elongated shape, and the short axis may be defined as the a longest line connecting two points of the elongated shape in a direction perpendicular to the long axis. In some alternative embodiments, the long axis of an elongated shape is along a direction of the elongation, while the short axis is along a direction perpendicular to the long axis. In some embodiments, a long axis may be defined as the longest line connecting two points of an elongated shape, and the short axis may be defined as a dimension of the elongated shape that is along a line bisecting the long axis. In some embodiments, the conductive via 116a of FIG. 2A has a non-circular ellipse shape in the top view, the long axis LA1 is then the major axis and the short axis SA1 the minor axis. In some embodiments, the long axis LA1 may have a length of between about 5.5 µm to about 450 µm, and the short axis SA1 may have a length of between about 5 µm to about 400 µm. In some embodiments, the length of the long axis LA1 may be between about 1.1 to about 40 times the length of the short axis SA1.

The conductive post 118 may also have an elongated shape in a top view. That is, the conductive post 118 has a long axis LA2 and a short axis SA2. Although conductive post 118 is shown to have an oval shape, in some alternative embodiments, the conductive post 118 may have any other shape other than oval. For example, the conductive post 118 may be circular, a rectangle with rounded edges, or a stadium shape. The sectional shape and size of the conductive post 118 defines an enclosure region 160 which limits the size of the conductive vias 116a. The conductive via 116a may be designed to have a sectional area smaller than the enclosure region 160 and be located anywhere within the enclosure region 160. In some embodiments, the shape and size of the enclosure region 160 may be dependent on the shape of the conductive post 118. In some embodiments, the enclosure region 160 may have an area of about 0.01 to about 0.99 times the area of the conductive post 118. In some embodiments, the enclosure region 160 is concentric with the conductive post 118.

Still referring to FIG. 2A, the long axis LA1 of the conductive via 116a is substantially parallel to the long axis LA2 of the conductive post 118. Further, the conductive via 116a has an area smaller than the enclosure region 160 and the center point C1 of the conductive via 116a is offset from the center point C2 of the conductive post 118 (i.e. eccentric). In some embodiments, the conductive via 116a may have an area between about 0.05 to about 0.99 times the area of the conductive post 118 in a top view. In some embodiments, the conductive via 116a may have an area between about 0.05 to about 1.0 times the area of the enclosure region 160 in a top view. In some embodiments, the profile of the conductive via 116a may be designed to be identical to the enclosure region 160.

Figure 2B:
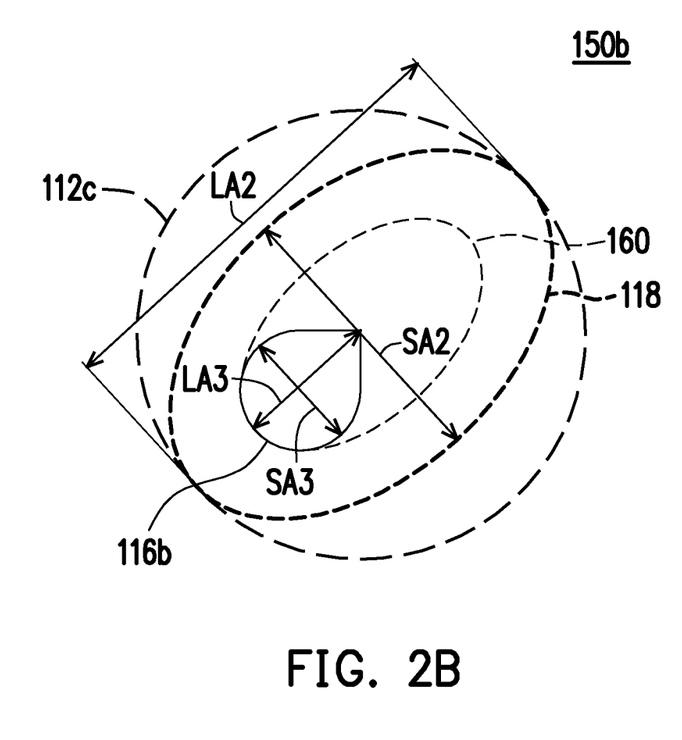

FIG. 2B shows the portion 150b in accordance with an alternative embodiment. Similar to FIG. 2A, in the sectional view, the portion 150b of FIG. 2B includes the circular landing pad 112c, the oval shaped conductive post 118 and an elongated conductive via 116b between the landing pad 112c and the conductive post 118. The difference between FIG. 2B and FIG. 2A lies in the shape of the conductive via 116b. That is, the elongated conductive via 116b is tear-drop shaped. The conductive via 116b may have a long axis LA3 extending along the line bisecting the tear-drop shape and a short axis SA3 perpendicular to the long axis LA3. In FIG. 2B, the long axis LA3 of the conductive via 116b is substantially parallel to the long axis LA2 of the conductive post 118 and the center point of the conductive via 116b is offset from the center point of the conductive post 118 (i.e. eccentric). In some embodiments, the long axis LA3 may have a length of between 5 µm to about 400 µm, and may be between about 1.1 to about 40 times the length of the short axis SA3.

Figure 2C:
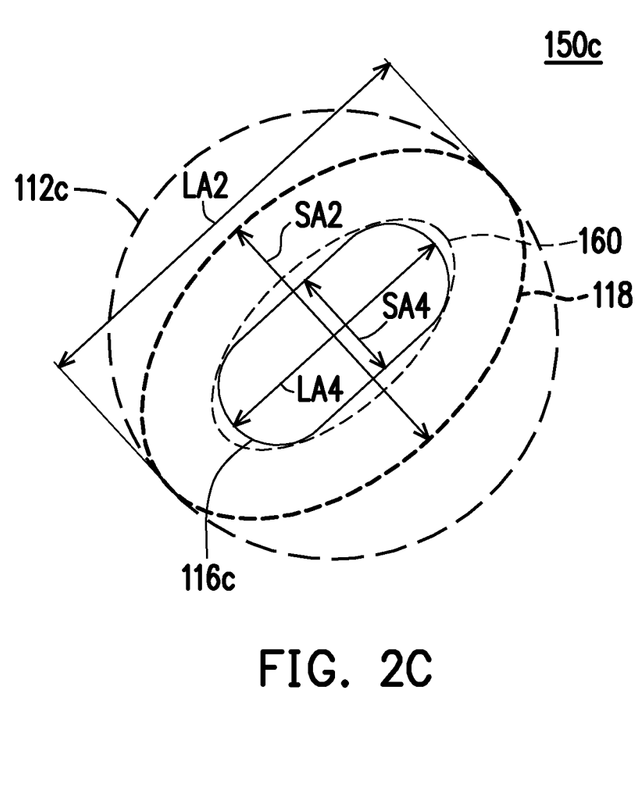

FIG. 2C shows the portion 150c in accordance with an alternative embodiment. Similar to FIG. 2A, in the sectional view, the portion 150c of FIG. 2B includes the circular landing pad 112c, the oval shaped conductive post 118 and an elongated conductive via 116c between the landing pad 112c and the conductive post 118. The difference between FIG. 2C and FIG. 2A lies in the shape of the conductive via 116c. That is, the elongated conductive via 116c is stadium shaped, wherein the stadium shape is constructed by having semicircles at a pair of opposite ends of a rectangle. The conductive via 116c may have a long axis LA4 extending along the length of the stadium shape and a short axis SA4 perpendicular to the long axis LA4. In FIG. 2C, the long axis LA4 of the conductive via 116c is substantially parallel to the long axis LA2 of the conductive post 118. In some embodiments, the long axis LA4 may have a length of between about 5 µm to about 400 µm, and may be between about 1.1 to about 40 times the length of the short axis SA4.

Figure 2D:
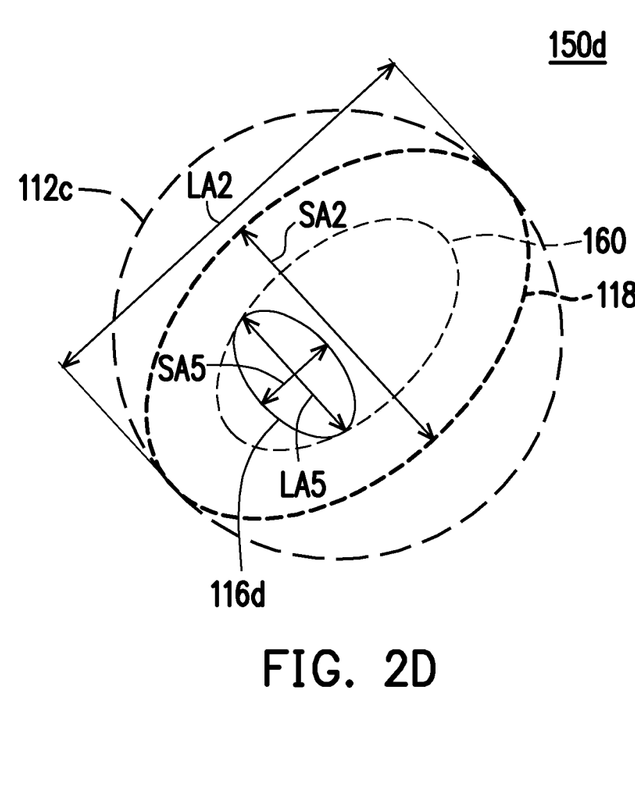

FIG. 2D shows the portion 150d in accordance with an alternative embodiment. Similar to FIG. 2A, in the sectional view, the portion 150d of FIG. 2D includes the circular landing pad 112c, the oval shaped conductive post 118 and an elongated conductive via 116d between the landing pad 112c and the conductive post 118. The difference between FIG. 2D and FIG. 2A lies in that the orientation of the oval shaped conductive via 116d is rotated 90° with respect to the conductive post 118. That is, the long axis LA5 of the conductive via 116d is substantially perpendicular to the long axis LA2 of the conductive post 118, and the short axis SA5 of the conductive via 116d is substantially perpendicular to the short axis SA2 of the conductive post 118. Due to the constrain of the enclosure region 160, conductive via 116d in this orientation may be smaller than the conductive via 116a having long axis LA1 substantially parallel to the long axis LA2 of the conductive post 118.

Although FIG. 2D shows the elongated conductive via 116d in an oval shape similar to the conductive via 116a of FIG. 2A, the conductive via 116d may have any other elongated shape having the elongation direction (i.e. long axis) substantially perpendicular to the long axis LA2 of the conductive post 118. For example, the conductive via 116d may have the tear-drop shape of conductive via 116b (see FIG. 2B) or the stadium shape of the conductive via 116c (see FIG. 2C). In some embodiments, the long axis LA5 may have a length of between about 5 µm to about 400 µm, and may be between about 1.1 to about 40 times the length of the short axis SA5. In some alternative embodiments, the angle between the long axis LA5 of the conductive via 116d and the long axis LA2 of the conductive post 118 may be any angle other than 0° and 90°. For example, the angle between the long axis LA5 of the conductive via 116d and the long axis LA2 of the conductive post 118 may be 30 degree, 45 degree, or 60 degree.

Figure 3:
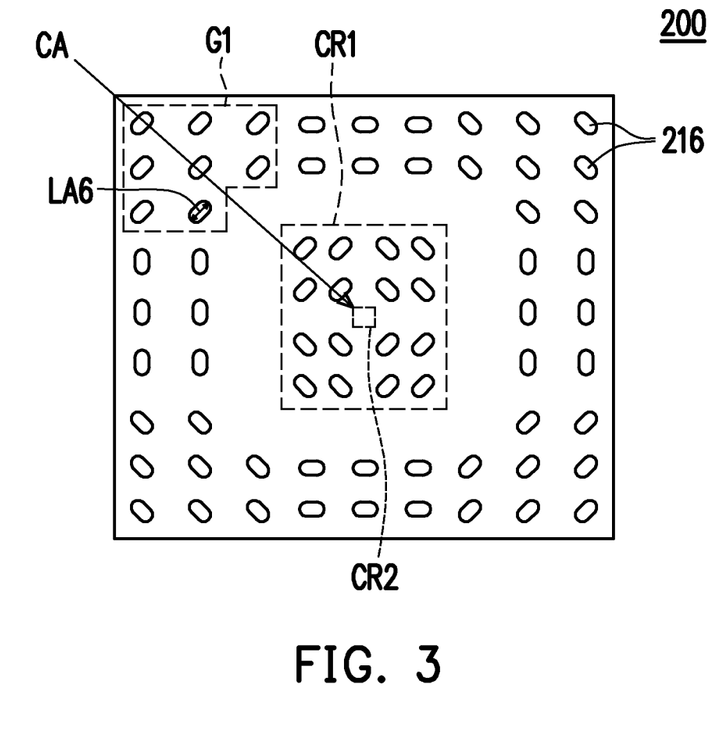
FIGS. 3 and 4 illustrate top view of a semiconductor package in accordance with some embodiments.

FIG. 3 illustrates a top view of a semiconductor package 200 showing arrangement of conductive vias 216 in accordance with some embodiments. The semiconductor package 200 may be similar to semiconductor package 100 of FIG. 1 except having conductive vias 216 instead of conductive vias 116. FIG. 3 shows the elongated conductive vias 216 being arranged in an array. The conductive vias 216 are shown to have a stadium shape. In some embodiments, the elongation of conductive vias 216 may be similar to conductive via 116a, 116b, 116c, or 116d of FIGS. 2A-2D. The conductive vias 216 may be provided in a central region CR1 and an edge region surrounding the central region CR1 of the semiconductor package 200. The conductive vias 216 may be arranged into groups, wherein for a particular group of conductive vias 216, elongation of the conductive vias 216 may be along the same direction.

In FIG. 3, long axis of each of the conductive vias 216 are substantially perpendicular to the center axes of their respective group. Herein, the center axis of each of the groups of conductive vias 216 may be a line that connects the corresponding group of conductive vias 216 to the center region CR2 of the semiconductor package 200. Each group of the conductive vias 216 provided at different locations of the semiconductor package 200 have different center axes, and therefore, the conductive vias 216 belonging to different groups may have different orientations.

For example, as shown in FIG. 3, the conductive vias 216 on the top left corner of the semiconductor package having same orientation may belong to a same group G1. In the group G1, the conductive vias 216 are oriented such that the long axis LA6 of the conductive vias 216 are substantially perpendicular to a center axis CA of the group G1.

Figure 4:
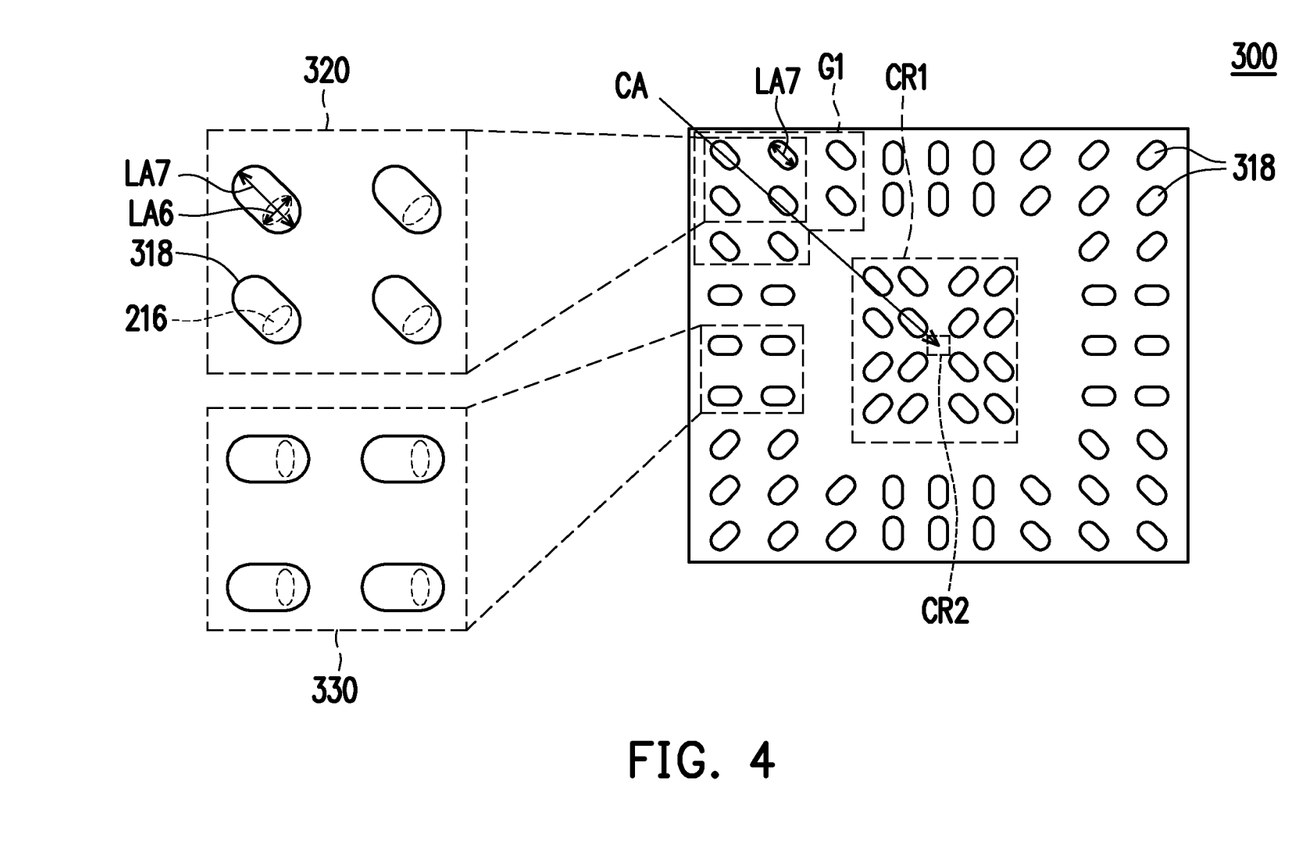

FIG. 4 illustrates a top view of a semiconductor package 300 showing arrangement of conductive posts 318 in accordance with some embodiments. The semiconductor package 300 may be similar to semiconductor package 100 of FIG. 1 except having conductive posts 318 instead of conductive posts 118. FIG. 4 shows that the elongated conductive posts 318 being arranged in an array. The conductive posts 318 are shown to have a stadium shape. By providing the conductive posts 318 with an elongated shape, additional space may be provided between the conductive posts 318, and chances of solder layers on the conductive posts 318 shorting with each other may be reduced.

In some embodiments, the conductive posts 318 may be shaped similar to conductive posts 118 of FIGS. 2A-2D. The conductive posts 318 may be provided in a central region CR1 and an edge region surrounding the central region CR1 of the semiconductor package 300. The conductive posts 318 may be arranged into groups, wherein for a particular group of conductive posts 318, elongation of the conductive posts 318 may be along the same direction.

In FIG. 4, long axis of each of the conductive vias 318 are substantially parallel to the center axes of their respective group. Herein, the center axis of each of the groups of the conductive posts 318 may be a line that connects the corresponding group of the conductive posts 318 to the center region CR2 of the semiconductor package 300. Each group of the conductive posts 318 provided at different locations of the semiconductor package 300 have different center axes, and therefore, the conductive posts 318 belonging to different groups may have different orientations.

For example, as shown in FIG. 4, the conductive posts 318 on the top left corner of the semiconductor package having same orientation may belong to a same group G1. In the group G1, the conductive posts 318 are oriented such that the long axis LA7 of the conductive posts 318 are substantially parallel to a center axis CA of the group G1.

In some embodiments, the conductive posts 318 may be connected to the conductive vias 216 of FIG. 3. That is, the conductive posts 318 may be formed over the conductive vias 216 of FIG. 3. In FIG. 4, arrangement of conductive posts 318 being connected to the conductive vias 216 are shown in enlarged portions 320 and 330 of the semiconductor package 300. In the enlarge portion 320 and 330, the long axis LA6 of the conductive vias 216 are arranged to be substantially perpendicular to the long axis LA7 of the conductive post 318. The arrangement of conductive via 216 being substantially perpendicular to the conductive posts 318 may be similar to the conductive via 116d and conductive post 118 shown in FIG. 2D.

In some alternative embodiments, the conductive posts 318 may be connected to conductive vias that are arranged in a manner different from conductive vias 216 of FIG. 3. For example, in some embodiments, the conductive posts 318 may be connected to elongated conductive vias that have long axis being substantially parallel to the long axis LA7 of conductive posts 318, such as similar to conductive via 116a and conductive posts 118 shown in FIG. 2A. In other words, the conductive vias connected to the conductive posts 318 may be oriented similar to the conductive posts 318 shown in FIG. 4. In yet another alternative embodiment, the conductive posts 318 may be connected to an array of elongated conductive vias that have long axes in a same direction (i.e. left to right direction). In other words, the conductive posts 318 in different groups may have long axis LA7 forming different angles with the long axis of the conductive vias.

Figure 5:
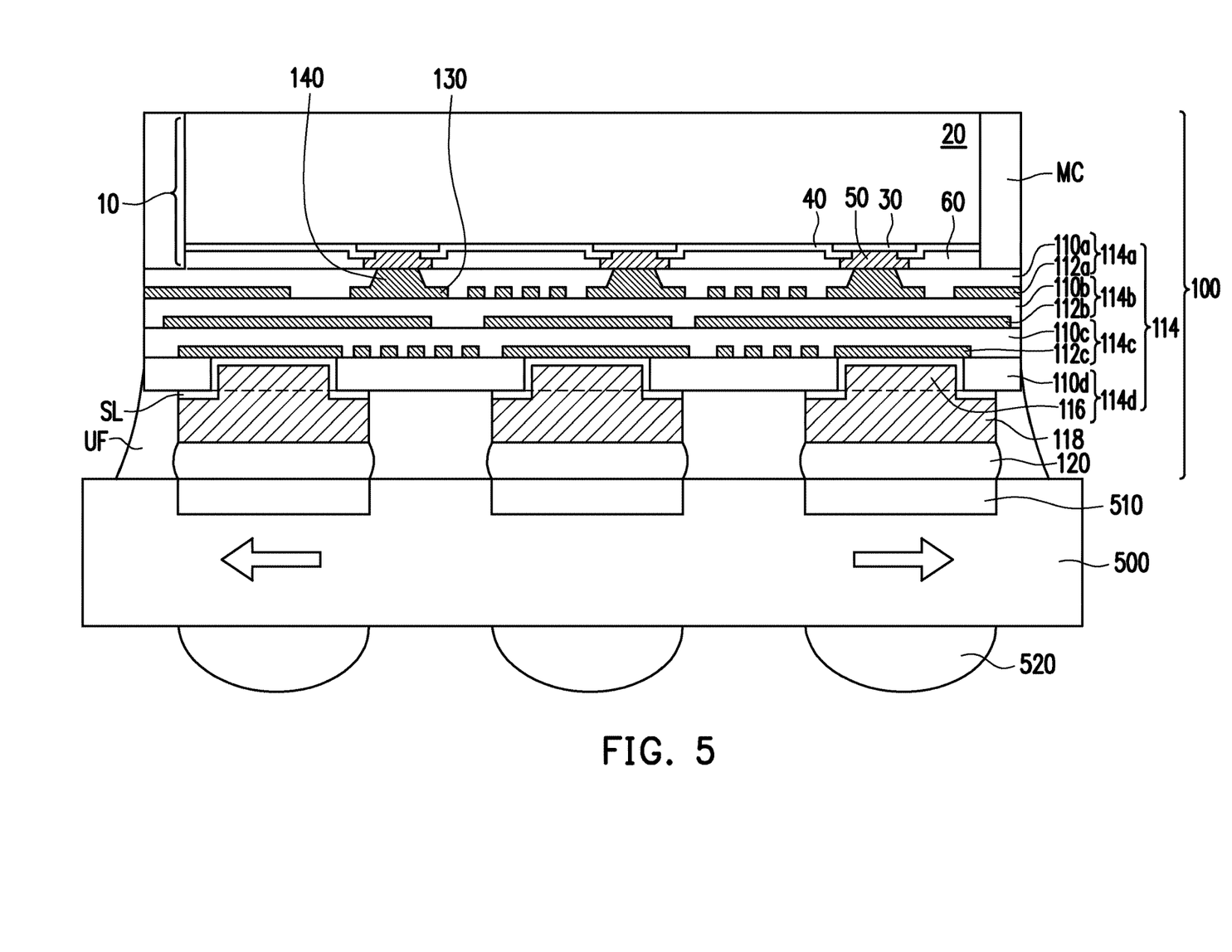
FIGS. 5 and 6 illustrate cross-sectional views of semiconductor devices having the semiconductor package of FIG. 1 in accordance with some embodiments.
Figure 6:
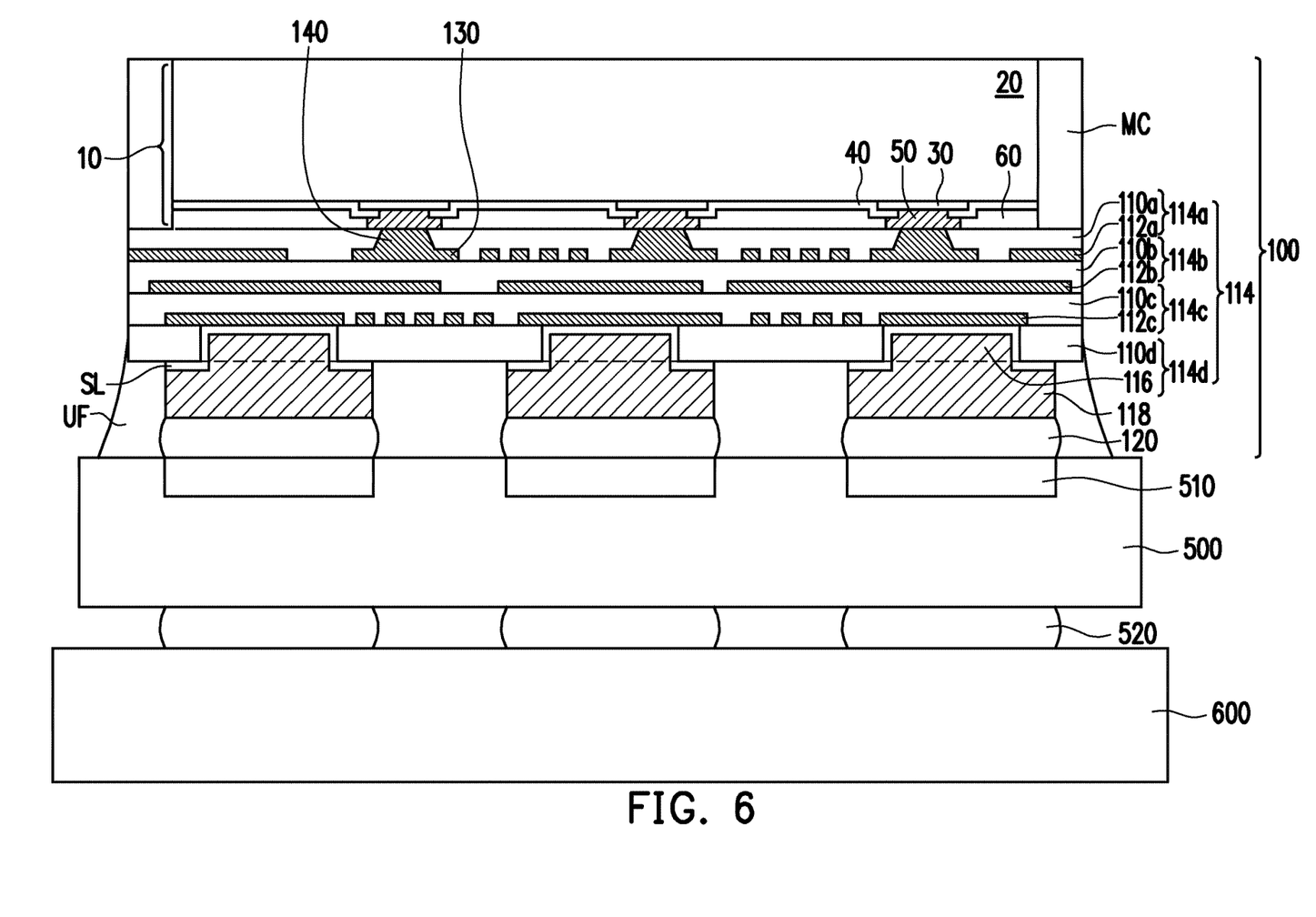

Referring now to FIG. 5, the semiconductor package 100 is bonded to a circuit substrate 500 to form a semiconductor device. In some embodiments, the circuit substrate 500 may be a ball grid array (BGA) substrate, a flip-chip substrate, an interposer, an organic substrate or the like. The solder layers 120 disposed over the conductive posts 118 may be bonded to the connection pads 510 of the circuit substrate 500 through a thermal reflow process. In some embodiments, the connection pads 510 may be bumps protruding from the surface of the circuit substrate. The circuit substrate 500 may have internal wirings to electrically connect the connection pads to respective solder balls 520 deposited on a surface of the circuit substrate 500 opposite the connection pads 510. An underfill UF may be disposed in the gap between the RDL 114 and the circuit substrate 500. The underfill UF may be a polymer, an epoxy, a resin or the like. The semiconductor device having the semiconductor package 100 and circuit substrate 500 may be further connected to a circuit board 600 as shown in FIG. 6. In some alternative embodiments, the semiconductor package 100 may be directly connected to the circuit board 600. In some embodiments, the circuit board 600 may be a printed circuit board (PCB), an organic substrate, a ceramic substrate, a motherboard, or the like.

It should be understood that, in accordance with other embodiments, semiconductor package 200 of FIG. 3 and semiconductor package 300 of FIG. 4 may also be bonded to the circuit substrate 500 of FIG. 5 or to the circuit board 600 to form a semiconductor device, and the connection would be analogous to the semiconductor package 100 as discussed above.

Due to coefficient of thermal expansion (CTE) mismatch between the circuit substrate 500 and the semiconductor package 100 (200 or 300), the circuit substrate 500 having large CTE may experience a lateral expansion (see arrow of FIG. 5) greater than the semiconductor package 100 during thermal cycles. As a result, the conductive posts 118 near the edge of the semiconductor package 100 may experience a large torque, causing the conductive vias 116 underneath to impose a large amount of stress on the RDL 114. The stress from the conductive vias 116 may break the conductive features 112c directly thereunder, or cause layers 114a, 114b, 114c and 114d to delaminate.

By providing the conductive vias 116 directly under the conductive posts 118 to be elongated in the lateral dimension (e.g. conductive vias 116a-116d shown in FIGS. 2A-2D), the stress imposed on the corresponding conductive features 112c may be reduced to a level preventing conductive features 112c from breaking, and also to a level preventing layers in RDL 114 from delaminating. Therefore, providing the conductive vias 116 with a laterally elongated shape may effectively reduce the defects on the semiconductor package 100. For example, the elongated conductive vias 116 (e.g. conductive vias 116a-116d shown in FIGS. 2A-2D) may be arranged in a manner similar to the conductive vias 216, discussed above with reference to FIG. 3, to reduce the stress on the RDL 114. In some embodiment, the semiconductor package 100 may further include conductive posts 118 that have laterally elongated shapes (e.g. conductive posts 118 shown in FIGS. 2A-2D) to further reduce the stress on semiconductor package. For example, the conductive posts 118 may be arranged in a manner similar to the conductive posts 318, discussed above with reference to FIG. 4.

In accordance with some embodiments of the present disclosure, a semiconductor package is provided. The semiconductor package includes a semiconductor die being encapsulated by an insulating encapsulation, a redistribution circuit structure being disposed over the semiconductor die and the insulating encapsulation, the redistribution circuit structure is electrically connected to the semiconductor die; and a conductive feature including a first portion embedded in the redistribution circuit structure and a second portion connected to the first portion, the first portion having a first long axis and a first short axis perpendicular to the long axis in a top view, the second portion disposed over and electrically connected to the first portion.

In accordance with alternative embodiments of the present disclosure, a semiconductor device including a semiconductor package and a circuit substrate is provided. The semiconductor package includes a semiconductor die laterally encapsulated by an insulating encapsulation, a redistribution circuit structure disposed over the semiconductor die and the insulating encapsulation, the redistribution circuit structure is electrically connected to the semiconductor die, the redistribution circuit structure includes a plurality of metal vias having long axis and a short axis perpendicular to the long axis in a top view, and a plurality of metal posts being disposed over and electrically connected to the plurality of metal vias of the redistribution circuit structure.

In accordance with yet another alternative embodiment of the present disclosure, a semiconductor device including a semiconductor package, a circuit board and a circuit substrate is provided. The circuit substrate is disposed on and electrically connected to the circuit board. The semiconductor package is disposed on and electrically connected to the circuit substrate. The semiconductor package includes a semiconductor die; a redistribution circuit layer between the semiconductor die and the circuit substrate, the redistribution circuit layer being electrically connected to the semiconductor die; a conductive via being embedded in and electrically connected to the redistribution circuit layer; and a conductive post being electrically connected to the redistribution circuit layer through the conductive via, the redistribution circuit layer being electrically connected to the circuit substrate through the conductive via and the conductive post, wherein the conductive post and the conductive via are elongated in a top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
a semiconductor die encapsulated by an insulating encapsulation,
a redistribution circuit structure disposed over the semiconductor die and the insulating encapsulation, the redistribution circuit structure electrically connected to the semiconductor die; and
a conductive feature comprising a first portion embedded in the redistribution circuit structure and a second portion connected to the first portion, the first portion having a first long axis and a first short axis perpendicular to the first long axis in a top view, the second portion disposed over and electrically connected to the first portion.

2. The semiconductor package of claim 1, wherein the second portion has a second long axis and a second short axis perpendicular to the second long axis in the top view, and the second long axis extends in a direction towards a center region of the semiconductor package.

3. The semiconductor package of claim 2, wherein the first long axis is substantially parallel to the second long axis.

4. The semiconductor package of claim 2, wherein the first long axis is substantially perpendicular to the second long axis.

5. The semiconductor package of claim 1, wherein a length of the first long axis is between about 1.1 to about 40 times a length of the first short axis.

6. The semiconductor package of claim 1, wherein the second portion is about 1.1 to about 100 times the size of the first portion in the top view.

7. A semiconductor device, comprising:
a semiconductor package, comprising:
a semiconductor die laterally encapsulated by an insulating encapsulation,
a redistribution circuit structure disposed over the semiconductor die and the insulating encapsulation, the redistribution circuit structure electrically connected to the semiconductor die, the redistribution circuit structure comprising a plurality of metal vias having a first long axis and a first short axis perpendicular to the first long axis in a top view,
a plurality of metal posts disposed over and electrically connected to the plurality of metal vias of the redistribution circuit structure; and
a circuit substrate bonded to the metal posts of semiconductor package.

8. The semiconductor device of claim 7, wherein each of the plurality of metal posts has a second long axis and a second short axis perpendicular to the second long axis of the metal posts in a top view.

9. The semiconductor device of claim 8, wherein each of the second long axis of the plurality of metal posts extends in a direction towards a center region of the semiconductor package.

10. The semiconductor device of claim 8, wherein the second long axis of the plurality of metal posts is substantially perpendicular to the second long axis of the metal via.

11. The semiconductor device of claim 7, further comprising a printed circuit board electrically connected to the semiconductor package through the circuit substrate.

12. The semiconductor device of claim 7, wherein the first long axis of the plurality of metal vias is about 1.1 to 40 times the first short axis of the plurality of metal vias.

13. The semiconductor device of claim 7, wherein the first long axis of the plurality of metal vias is substantially perpendicular to a direction from the metal vias to a center of the semiconductor package.

14. A semiconductor device, comprising:
a circuit board;

a circuit substrate disposed on and electrically connected to the circuit board;

a semiconductor package disposed on and electrically connected to the circuit substrate, the semiconductor package comprising:

a semiconductor die;

a redistribution circuit layer between the semiconductor die and the circuit substrate, the redistribution circuit layer being electrically connected to the semiconductor die;

a conductive via embedded in and electrically connected to the redistribution circuit layer; and a conductive post electrically connected to the redistribution circuit layer through the conductive via, the redistribution circuit layer being electrically connected to the circuit substrate through the conductive via and the conductive post, wherein the conductive via has a first long axis and a first short axis perpendicular to the first long axis in a top view, and the conductive post has a second long axis and a second short axis perpendicular to the second long axis in the top view.

15. The semiconductor device of claim 14, wherein the second long axis extends in a direction towards a center region of the semiconductor package.

16. The semiconductor device of claim 15, wherein the first long axis of the conductive via is substantially perpendicular to the second long axis of the conductive post.

17. The semiconductor device of claim 15, wherein the first long axis of the conductive via is substantially parallel to the second long axis of the conductive post.

18. The semiconductor device of claim 14, wherein a center point of the conductive post is offset from a center point of the conductive via in the top view.

19. The semiconductor device of claim 14, further comprising a solder layer between the conductive post and the circuit substrate.

20. The semiconductor device of claim 14, wherein a length to width ratio of the conductive via in the top view is between about 1.1 to about 40.

* * * * *